United States Patent

Moritz et al.

[11] Patent Number: 5,866,062
[45] Date of Patent: Feb. 2, 1999

[54] PROCESS FOR PRODUCING SHAPED BODIES OF SILICON DIOXIDE

[75] Inventors: Stephan Moritz, Erlensee; Wolfgang Englisch, Kelkheim, both of Germany

[73] Assignee: Heraeus Quarzglas GmbH, Hanau, Germany

[21] Appl. No.: 814,713

[22] Filed: Mar. 11, 1997

Related U.S. Application Data

[60] Division of Ser. No. 636,889, Apr. 24, 1996, Pat. No. 5,674,792, which is a continuation-in-part of Ser. No. 338,752, Nov. 10, 1994, abandoned.

[30] Foreign Application Priority Data

Nov. 12, 1993 [DE] Germany ............... 43 38 807.8

[51] Int. Cl.⁶ .................................................. C04B 33/28
[52] U.S. Cl. .................... 264/637; 264/651; 264/660; 264/655; 264/86; 264/87; 65/17.3; 65/17.6
[58] Field of Search .................... 264/637, 651, 264/660, 655, 86, 87; 65/17.3, 17.6

[56] References Cited

U.S. PATENT DOCUMENTS

| | | |
|---|---|---|
| 3,301,635 | 1/1967 | Bergna et al. . |
| 3,972,704 | 8/1976 | Loxley et al. . |
| 4,040,795 | 8/1977 | Jung . |
| 4,072,489 | 2/1978 | Loxley et al. .............. 65/173 |
| 5,063,003 | 11/1991 | Gonzalez-Oliver . |
| 5,302,364 | 4/1994 | Feinblum . |
| 5,360,773 | 11/1994 | Winkelbauer et al. . |
| 5,585,173 | 12/1996 | Kamo et al. .............. 65/17.3 |

FOREIGN PATENT DOCUMENTS

| | | |
|---|---|---|
| 0 475 549 | 8/1993 | European Pat. Off. . |
| 543 957 | 6/1932 | Germany . |
| 2 218 766 | 12/1972 | Germany . |

OTHER PUBLICATIONS

Keramische Zeitschrift, vol. 38, No. 8, 1986, pp. 442–445. Quarzglas und Quarzgut, Heraeus Quarzschmelze.

*Primary Examiner*—James Derrington
*Attorney, Agent, or Firm*—Finnegan, Henderson, Farabow, Garrett & Dunner, L.L.P.

[57] ABSTRACT

A shaped body of amorphous silicon dioxide, which has a chemical purity of at least 99.9% and a cristobalite content of at most 1% and which is impermeable to gas, is known. To provide shaped bodies of amorphous silicon dioxide which have a high precision, which can be small or large in size and of simple to complicated shape, which have a chemical purity of at least 99.9%, are impermeable to gas above wall thicknesses of 1 mm, which have a high cold flexural strength, low thermal conductivity and low radiation of heat, which are thermal shock resistant and can be exposed repeatedly or also long-term to temperatures in the range from 1000° to 1300° C. and which can be welded in a sharply delineated manner without spreading joins and which have a low spectral transmission from the ultraviolet to the middle infrared spectral region, the shaped body is opaque, contains pores, at a wall thickness of 1 mm has a direct spectral transmission which is virtually constant in the wavelength range from $\lambda=190$ nm to $\lambda=2650$ nm and is below 10%, and it has a density which is at least 2.15 g/cm³. A process for producing such shaped bodies is also provided.

17 Claims, 5 Drawing Sheets

PROCESS FOR PRODUCING SHAPED BODIES OF SILICON DIOXIDE

This is a divisional of application Ser. No. 08/636,889, filed Apr. 24, 1996, now U.S. Pat. No. 5,674,792, which is a CIP of application Ser. No. 08/338,752, filed Nov. 10, 1994, now abandoned.

BACKGROUND OF THE INVENTION

The invention relates, on the one hand, to a shaped body of amorphous silicon dioxide which has a chemical purity of at least 99.9% and a cristobalite content of at most 1% and which is impermeable to gas. In addition, the invention relates to a process for producing a gas-impermeable shaped body of amorphous silicon dioxide which has a chemical purity of at least 99.9% and whose cristobalite content is at most 1%, in which amorphous quartz glass starting material having a purity of at least 99.9% is comminuted to give a powder having a particle size below 70 μm, a slip is produced from the powder, the slip is, to produce a green shaped body, introduced into a porous mold corresponding to the shaped body and is left therein for a predetermined-time, after removal of the mold the green shaped body is dried and subsequently heated in a furnace to a temperature above 1200° C. and is then cooled.

Shaped bodies having a high silicon dioxide content of over 99.56% are used in many industrial fields. Examples of such fields of application which may be mentioned are: casting tubes for the continuous casting of steel or nonferrous metals, cores for producing pressure and investment castings, crucibles for drawing crystals, flanges for diffusion tubes in which, for example, semiconductor doping processes are carried out. In most applications, the shaped bodies are required to have high stability at temperatures in the region of 1000° C., and sometimes also high thermal shock resistance. To make possible the repeated use of the shaped body at temperatures above 1100° C., their cristobalite content should, because of cristobalite formation above about 1100° C., be at most a few per cent. The density of the shaped bodies produced by the slip casting process and usually sintered at temperatures in the range from 1100° C. to a maximum of 1250° C. (for this purpose, see Keramische Zeitschrift, volume 38, No. 8, 1986, pp. 442–445; EP 0 475 549 31) is in the range from 85% to 90% of the theoretical density of quartz glass. The cold flexural strength is given as 15 $N/mm^2$.

Shaped bodies having a density of about 95% of the theoretical density of quartz glass are obtained by heating quartzite sand in rotating molds by means of electric arcs (DE-543 957). These shaped bodies have, because of their method of production, rotational symmetry and may have to be further machined. They have a cold flexural strength of about 65 $N/mm^2$.

DE-A 22 18 766 discloses thin-walled vessels, in particular crucibles, for the drawing of single crystals comprising amorphous silicon dioxide of high purity. The cristobalite content of these vessels is at most 1% and they are, because of their method of production, impermeable to gas and transparent. They are produced by the slip casting process. The starting material used is vitreous silica having a chemical purity of at least 99.95% which is comminuted in conventional mills to give a powder in which the quartz particles should be no larger than 200 μm and the average particle size should be between 1 and 70 μm. A slip is prepared from this powder by addition of distilled water. To produce a green crucible, the slip is cast into a porous mold, for example made of plaster, corresponding in shape to the crucible to be produced, and is left therein for a time sufficient for the desired wall thickness to be formed. As soon as the crucible is sufficiently strong, it is taken from the mold and partially dried. Complete drying is carried out in a heating room at about 177° C. To remove all combustible constituents, for example polyurethane rubber abraded material, which are formed during comminution in the mill, and absorbed water, the crucible is slowly heated to 1150° C. After cooling to room temperature, the crucible is heated for from about 3 to 4 minutes at about 1680° C. on a graphite mandrel in a heating chamber under a helium atmosphere, until the crucible is transparent. The crucible is then allowed to cool in the helium atmosphere for about ½ minute to about 1480° C. to allow it to then be taken from the graphite mandrel by means of tongs and be left to cool to room temperature. To keep cristobalite formation as low as possible, i.e. below 1%, the crucible is exposed to the high temperature region above 1200° C. during the heating and cooling process for at most a time of 10 minutes. The wall thickness of the crucibles thus obtained is between 2 and 4 mm.

It is an object of the invention to provide shaped bodies of amorphous silicon dioxide which have high precision, which can be small or large in size and of simple to complicated shape, which have a chemical purity of at least 99.9%, are impermeable to gas above wall thicknesses of, in particular, 1 mm, which have a high cold flexural strength, low thermal conductivity and low radiation of heat, which are thermal shock-resistant and can be exposed repeatedly or also long-term to temperatures in the range from 1000° to 1300° C. and which can be welded in a sharply delineated manner without spreading joins and which have a low spectral transmission from the ultraviolet to the middle infrared spectral region.

It is a further object of the invention to provide a process which makes it possible to produce, in a technically simple and inexpensive manner, shaped bodies comprising amorphous silicon dioxide having any size-and wall thicknesses of up to 100 mm, which have high precision, high cold flexural strength, low thermal conductivity and thermal expansion, which are impermeable to gas and whose radiation transmission is low, particularly in the near and middle infrared region.

SUMMARY OF THE INVENTION

The object of the invention is achieved, for a shaped body of amorphous silicon dioxide which has a chemical purity of at least 99.9% and is impermeable to gas, by it being opaque, containing pores, at a wall thickness of 1 mm having a direct spectral transmission which is substantially constant in the wavelength range from $\lambda$=190 nm to $\lambda$=2650 nm and is below 10%, and it having a density which is at least 2.15 $g/cm^3$. The impermeability to gas here relates to normal room temperature, because quartz glass has no technically perceptible gas permeability at this temperature.

In the shaped body of the invention, at least 80% of the pores have a maximum pore dimension of less than 20 μm. The maximum pore dimension is advantageously less than 10 μm. The porosity of the shaped body is in the range from 0.5 to 2.5% per unit volume.

Furthermore, the shaped bodies of the invention advantageously have a cold flexural strength for a cross-sectional area of 4 mm×4 mm of at least 60 $N/mm^2$, which is considerably above that of known opaque shaped bodies of amorphous silicon dioxide and is comparable with that of transparent quartz glass shaped bodies. In individual cases, cold flexural strengths of above 90 N/mm² were even achieved.

Compared with commercial pore-containing opaque shaped bodies, the shaped bodies of the invention also have, at a wall thickness of 1 mm, a direct spectral transmission, i.e. the spectral transmission exclusive of any scattered radiation, which is substantially constant in the wavelength range from $\lambda=190$ nm to $\lambda=2650$ nm and is below 10%, which makes them suitable, for example, for filtering even in the near and middle infrared spectral region, i.e. to shield sensitive bodies against this radiation.

The minimum wall thickness of the shaped bodies of the invention is set by the maximum pore dimension, with the minimum wall thickness being, for reasons of strength and impermeability, about 3 to 5 times the maximum pore dimension, i.e. it is about 0.1 mm.

The shaped bodies of the invention preferably have a wall thickness in the range from 1 to 100 mm owing to their flexural strength, heat resistance and their high chemical purity, they are particularly suitable as support facility or as substrate for high-purity bodies such as, for example, silicon wafers which are subjected to high-temperature treatment at up to 1300° C. The shaped bodies of the invention are also very suitable as components in or for reactors of very high-purity quartz glass in which semi-finished silicon parts for semiconductor components are treated. They can also be made in the form of hollow bodies, preferably in the form of a flange or crucible, with the crucibles being able to be used, for example, for calcining inorganic substances such as phosphors, or as fusion crucibles, for example for gold. Here, owing to the high chemical purity of the shaped bodies, no contamination of the material to be treated therein need be feared, even at high temperatures. Shaped bodies of the invention in the form of flanges can be readily welded onto, for example, containers of transparent quartz glass, advantageously giving exact, sharply delineated and non-spreading joins.

BRIEF DESCRIPTION OF THE DRAWINGS

The shaped body of the invention and the process of the invention will now be illustrated with reference to the diagrams.

The diagrams show.

$\emptyset_{ef}=285$ mm, if $\emptyset_{if}=220$ mm, $th_f=12.7$ mm h=25.4 mm, $h_w$=12.7 mm, $th_w$=4 mm $\emptyset_{if}$=external diameter of flange $\emptyset_{if}$=internal diameter of flange $th_f$=thickness of flange h=total height $h_w$=height of web $th_w$=thickness of web

DETAILED DESCRIPTION OF THE INVENTION

Figure 1:
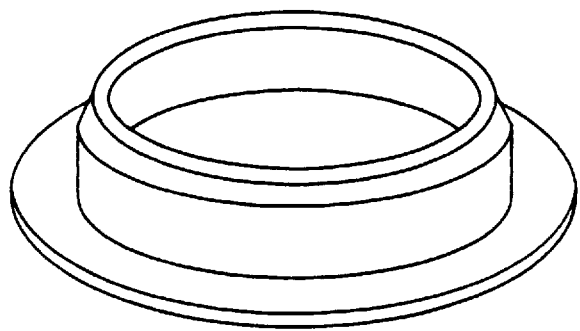
FIG. 1: a shaped body of the invention in the form of a flange, which has the following dimensions.
Figure 2:
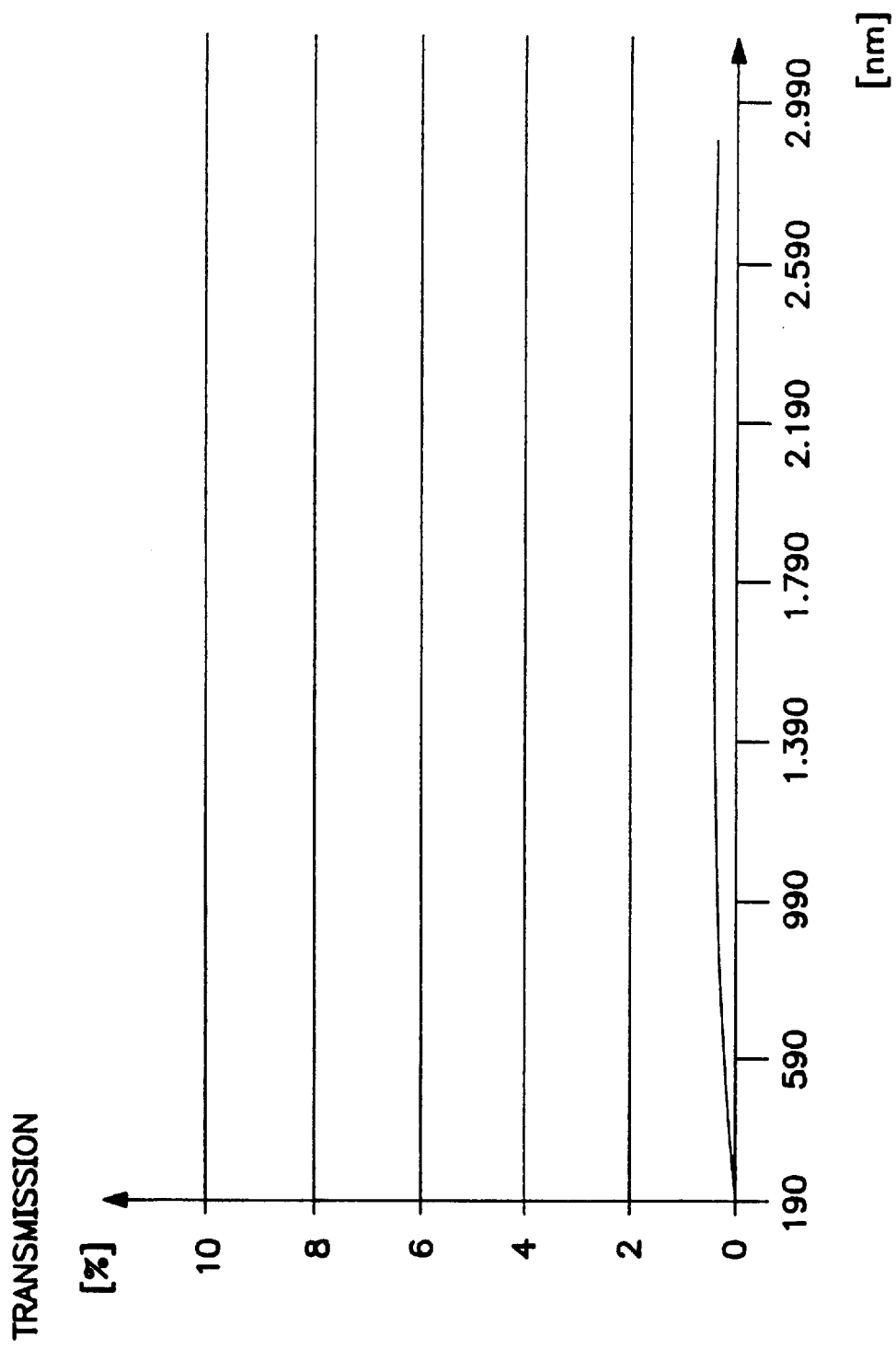
FIG. 2: a direct transmission spectrum of a shaped body according to the invention in the wavelength range from $\lambda=190$ nm to $\lambda=2650$ nm.

The direct spectral transmission curve shown in FIG. 2 was obtained using a tabular shaped body having a thickness of 1 mm. The measurements were carried out using a Perkin-Elmer LAMBDA 9 spectrophotometer without an Ulbricht globe. The surfaces of the test specimen were polished. As can be seen from the shape of the curve, the direct spectral transmission in the spectral range examined is substantially constant and is below 1%.

The shaped bodies of the invention can be machined equally well as transparent quartz glass shaped bodies; however, they do not have to be subjected to annealing prior to machining, as is necessary in the case of transparent quartz glass shaped bodies for reducing or eliminating stresses, because they are virtually stress-free. Their chemical resistance is also as good as that of transparent quartz glass shaped bodies. After welding or the sealing of their surface by flame polishing, for example by means of gas burners, no noticeable shrinkage can be found. The thermal conductivity of the shaped bodies according to the invention is about the same as that of transparent quartz glass shaped bodies.

Shaped bodies of the invention are preferably produced by the slip casting process. According to the invention, this slip casting process for producing an opaque, pore-containing shaped body whose direct spectral transmission at a wall thickness of 1 mm is substantially constant in the wavelength range from $\lambda=190$ nm to $\lambda=2650$ nm and is below 10%, comprises stabilizing the slip prior to its introduction into the porous mold by continual motion for a time of from 1 to 240 hours, depending on the amount of slip, heating the dry green shaped body in a furnace to a sintering temperature in the range from 1350° to 1450° C. at a heating rate of from 5 to 60 K/min, exposing it to a temperature of above 1300° C. for a time of at least 40 minutes and cooling the sintered shaped body at a cooling rate of above 5 K/min to a temperature of about 1000° C. This minimum time during which the dried green shaped body is exposed to a temperature of above 1300° C. for a time of at least 40 minutes is made up of the sum of the following times:

1. the time over which the green shaped body is heated from 1300° C. to the sintering temperature;
2. the time for which the green shaped body is held at the sintering temperature;
3. the time over which the green shaped body is cooled from the sintering temperature to 1300° C.

In comparison with known slip casting processes for producing shaped bodies, the process of the invention has, on the one hand, a high sintering temperature of 1350° to 1450° C., which is at least 100° C. above the sintering temperatures hitherto used of from 1100° to 1250° C., and, on the other hand, a time of at least 40 minutes for which the green shaped body is exposed to a temperature above 1300° C. This time is at least four times longer than the maximum time, which is not supposed to be exceeded, given for the production of transparent shaped bodies of silicon dioxide by the slip casting process (DE-A 22 18 766). The surprising thing is that the shaped bodies produced by the process of the invention have a cristobalite content of at most 1%.

The starting material used is high-purity amorphous silicon dioxide having a chemical purity of 99.9%, which is prepared in a manner known per se, for example from quartz sand or rock crystal. The starting material used for the process of the invention can advantageously also be quartz glass scrap, such as broken quartz glass as is obtained, for example, in the production of reactors for the treatment of semiconductor components or other quartz glass apparatus, provided that the condition of the chemical purity of at least 99.9% is fulfilled. This scrap, which was hitherto disposed of, can thus be reused for the production of shaped parts of high precision, which leads to not inconsequential raw material savings and cost savings, because such scrap does not, as regards chemical purity, have to be -again subjected to expensive purification processes.

The comminution of the starting material is carried out in apparatus known per se, with care having to be taken to ensure that no substantial amounts of non-removable impurities are introduced into the powder to be produced.

The slip introduced into the mold is preferably one having a pH of between 3 and 5. Here it has furthermore been shown to be advantageous to briefly subject the slip to reduced pressure prior to introduction into the mold, so as to remove any air bubbles present in the slip.

It has also been found to be useful, while introducing the slip into the mold and/or while it is left in the mold, to maintain a pressure difference between the free surface of the slip and the external surface of the mold not wetted by the slip, in such a way that the pressure on the external surface is lower than that on the free surface of the slip. If plaster is used as the material for the mold, it has been found to be advantageous to maintain a pressure of less than 0.8 bar on the external surface of the mold. This can be simply achieved by inserting the mold into a container which is maintained at a pressure below atmospheric pressure. If the pressure difference is to be increased, the slip can be introduced into the mold under superatmospheric pressure, i.e. by the pressure casting process. The pressure casting process for introducing the slip into the mold is to be recommended when the material used for the mold is a porous plastic. It has been found to be useful to leave the slip in the mold for a time of from 5 to 400 minutes to form a -green shaped body. The green shaped body is then dried by heating from room temperature to about 300° C., with the temperature being advantageously increased stepwise to 300° C. Here it has been found to be useful to select smaller temperature steps in the temperature range below 100° C. than in the temperature range from 100° to 300° C. In the drying, particularly good results are obtained if it is carried out under reduced pressure, for which purpose a commercial vacuum drying oven is used. To ensure complete drying and to simultaneously remove any organic impurities which could have been introduced into the powder and thus into the slip during comminution of the starting material as abraded material from the lining of the comminution apparatus, the green shaped body is heated to a temperature in the range from 900° to 1000° C. and held at this temperature for a time of from 30 to 200 min. The green shaped body thus obtained is then heated in a furnace, as already mentioned above, at a heating rate of from 5 to 60 K/min to the sintering temperature in the range from 1350° to 1450° C. and, depending on the heating rate, held for a set time at the sintering temperature and subsequently cooled at a cooling rate of over 5 K/min to a temperature of about 1000° C. The time for which the green shaped body is held at the sintering temperature is chosen so as to be increased with increasing heating rate. Further cooling in the furnace can be carried out as quickly or as slowly as desired, since this has no noticeable influence on the properties of the shaped body. Advantageously, an oxidizing atmosphere is maintained in the furnace for the high-temperature sintering of the green shaped body, which substantially simplifies the process.

During drying, heat treatment in the range from 900° to 1100° C., sintering and cooling, the green shaped body or the shaped body is arranged on a substrate, for example of highly chemically pure, recrystallized silicon carbide, i.e. on a material which does not react with the amorphous silicon dioxide of the shaped body.

In the production of shaped bodies having a very complicated shape, for example in the case of shaped bodies having undercuts, it was observed that the cooled shaped body had a thin, rough surface layer in the region of such points; this surface layer is then preferably removed mechanically or by brief treatment with hydrofluoric acid.

Figure 3:
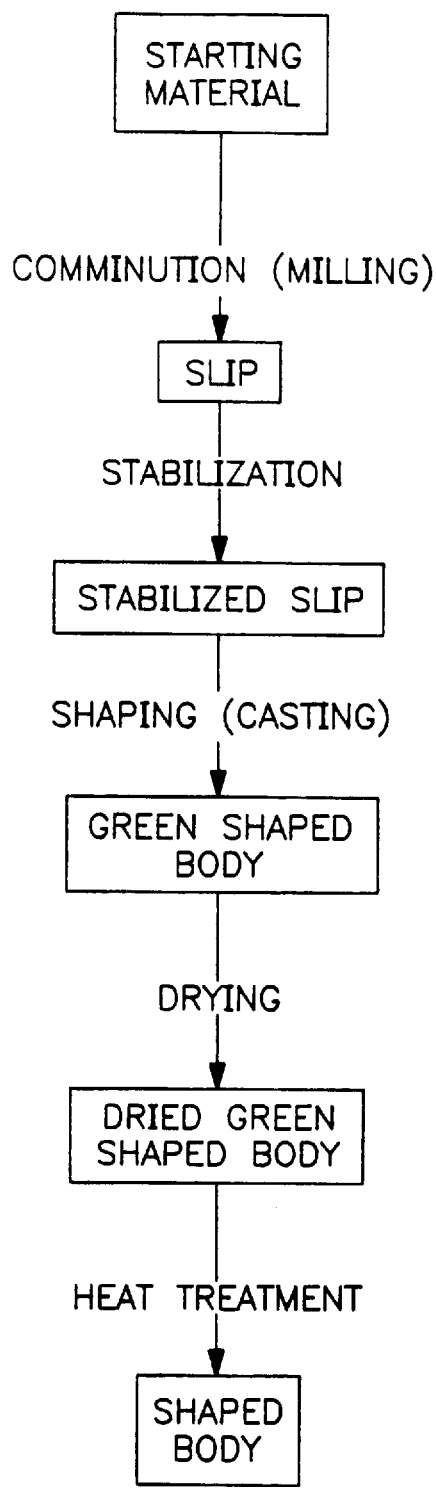
FIG. 3: a flow diagram showing the essential process steps of the process of the invention.

FIG. 3 once more shows the entire process in the form of a flow diagram, with only the essential process steps being indicated.

The example below describes, with reference to the flow diagram of FIG. 3, the production of an annular shaped body having the dimensions $\phi_e$=297 mm, $\phi_i$=206 mm, thickness= 16 mm.

The starting material used was an amorphous silicon dioxide grain having a chemical purity of better than 99.99% and a particle size distribution of 80% in the range from 355 to 2000 $\mu$m, 19%<355 $\mu$m and 1%>2000 $\mu$m.

This grain was milled together with demineralized water having a conductivity of $\leq$0.05 $\mu$S in a ball mill lined on all sides with polyurethane. The milling balls comprised quartz glass having a chemical purity of 99.99%. The milling charge had the following composition (in percent by mass):

42% of grain,
11% of water,
47% of milling balls.

This milling charge was milled for 240 hours at a rotation rate of 50 rpm. After milling, the particle size distribution was in the range from >0.45 $\mu$m to <50 $\mu$m, with the major proportion of about 60% being between 1 $\mu$m and 10 $\mu$m. The analysis of the particle size distribution was carried out using a laser light scattering apparatus.

After removal of the milling media from the slip, this was stabilized by the slip being kept in motion for 240 hours in the ball mill at a rotation rate of 50 rpm. After this stabilization, sedimentation phenomena were no longer observed in the slip. The solids content of the slip was between 78 and 79%, its pH was about 4.5. Before the slip was introduced into the mold, it was subjected for 20 minutes to a reduced pressure of 0.8 bar to remove any air bubbles within the slip.

The slip thus produced was then allowed to run over a period of 30 seconds, without bubbles, into a mold made of commercial hard plaster (pressing mold plaster), provided with venting channels, previously cleaned with dust-free and oil-free compressed air and demineralized water (conductivity$\leq$0.05 $\mu$S) and having dimensions of the recess: $\phi_e$=315 mm, $\phi_i$=218 mm, height=17 mm, with the reduced slip level being topped up at regular intervals for three hours. After a further three-hour residence time in the mold, the green shaped body formed was taken from the mold while introducing purified air into the venting channels. While introducing the slip into the mold and also during the residence time in the mold, a reduced pressure of 0.1 bar was maintained on the external surface of the mold not wetted by the slip, while the liquid surface of the slip was under normal atmospheric pressure.

Figure 4:
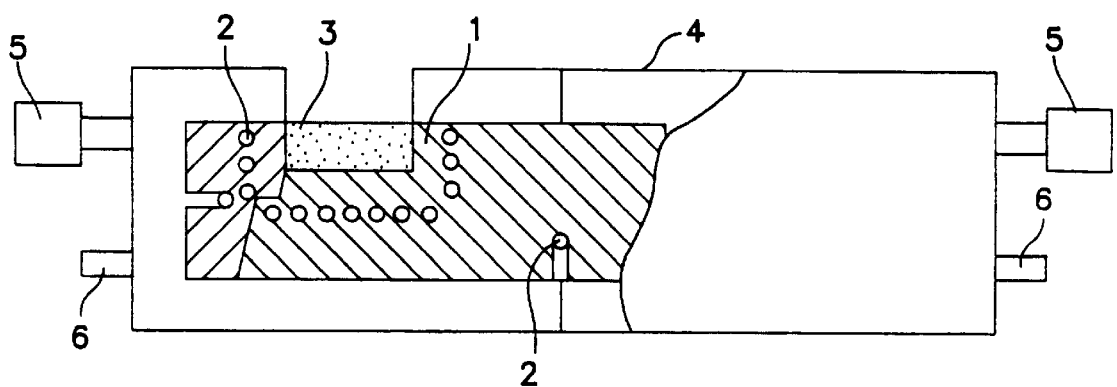
FIG. 4: a vertical section through the mold filled with slip as described in the example.

FIG. 4 shows a vertical section of the mold filled with slip. The reference number 1 denotes the multipiece mold provided with venting channels 2, the recess of which mold is filled with slip 3. The mold 1 is fitted in a gastight manner in the housing 4 which is maintained at a reduced pressure of 0.1 bar in the interior by means of the pump 5. To take out the green shaped body, the pump 5 is switched off and compressed air is introduced into the housing 4 via the compressed air connection 6.

The green shaped body was subsequently dried in a drying oven under a normal atmosphere. To ensure with certainty gentle and damage-free removal of residual water from the green shaped body, heating was carried out stepwise to 300° C., with the temperature stages being 30°, 45°, 70°, 95°, 110°, 200° and 300° C., and the residence times of the green shaped body at the specified temperatures being 15, 15, 15, 15, 15, 8 and 8 hours.

To remove small amounts of absorbed residual water still present in the green shaped body after drying and also to remove any organic abraded impurities which have resulted from the milling process, the dried green shaped body was heated in a fiber-lined, electrically heated furnace under air to a temperature of 1000° C. at a heating rate of 5 K/min and held at this temperature for a time of 2 hours, with the green shaped body being supported on a substrate of recrystallized silicon carbide previously baked out at 1700° C. The green shaped body then had a density of 2.0 g/cm$^3$ and an open-pored microstructure.

The high-temperature treatment of the green shaped body was then carried out in the above described furnace. The heating rate to the sintering temperature of 1400° C. was 10 K/min. The holding time of the green shaped body at the sintering temperature was 60 minutes. The shaped body was then cooled at a cooling rate of 10 K/min from 1400° C. to 1000° C. and from then until its removal from the furnace at a rate corresponding to the natural cooling curve of the furnace, which took about 8 hours. The shaped body was taken from the furnace at a temperature of 300° C. Its density was determined to be 2.18 g/cm$^3$.

Figure 5:
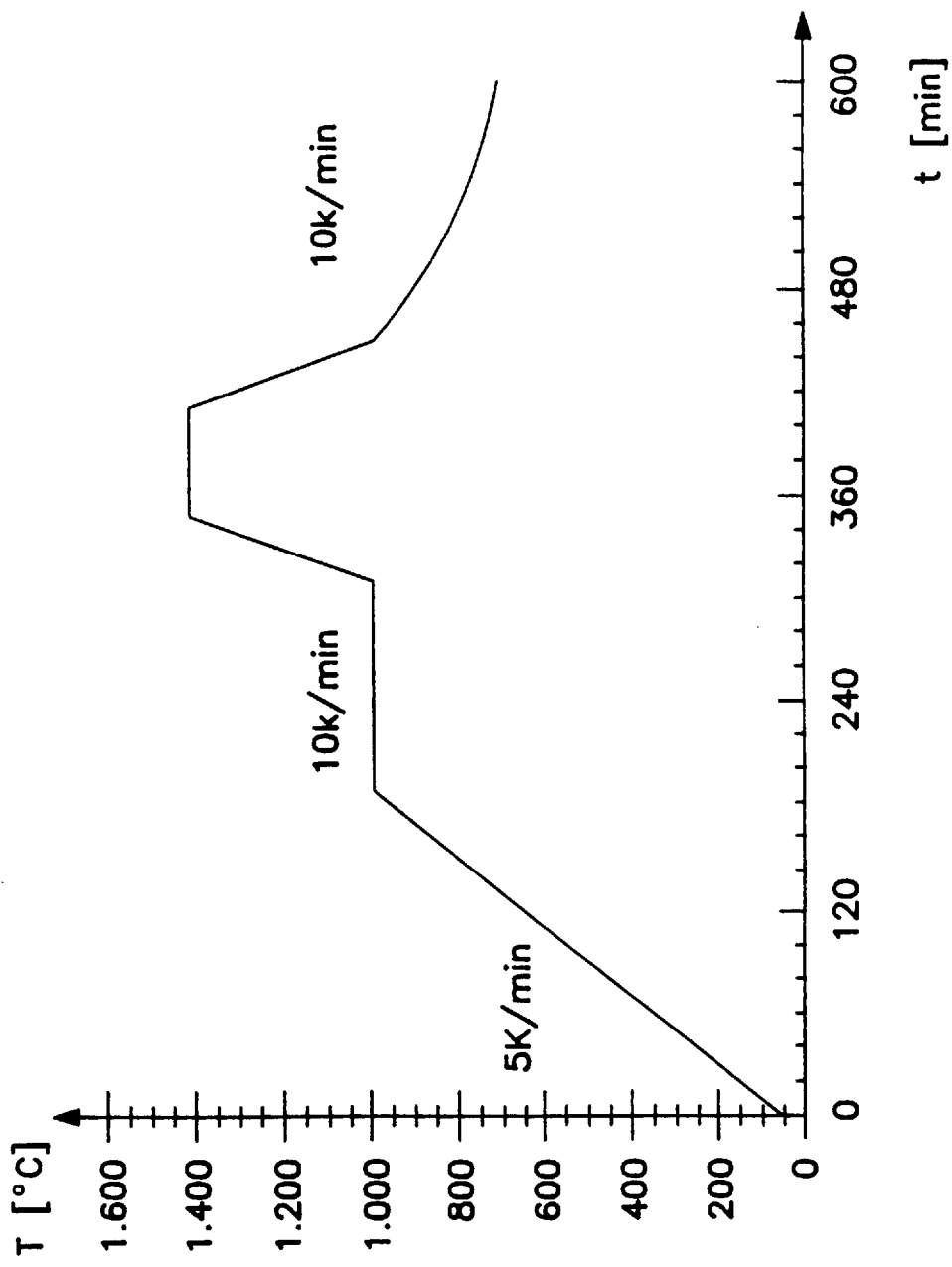
FIG. 5: the temperature as a function of time for the heating of the dried green shaped body.

FIG. 5 shows the temperature as a function of time for the heating of the dried green shaped body as described above.

We claim:

1. A process for producing a gas-impermeable opaque, pore-containing shaped body of amorphous silicon dioxide, having a porosity of 0.5 to 2.5% per unit volume, which has a chemical purity of at least 99.9% and whose cristobalite content is at most 1%, said pore containing shaped body having direct spectral transmission at a wall thickness of 1 mm that is substantially constant in the wavelength range from λ–190 nm to λ–2650 nm and is below 10%, comprising comminuting an amorphous quartz glass starting material having a purity of at least 99.9% to give a powder having a particle size below 70 μm, preparing a slip from said powder, stabilizing said slip by keeping it in continual motion for a time of from 1 to 40 hours to produce a stabilized slip, followed by producing a green shaped body by introducing said stabilized slip into a porous mold corresponding to said shaped body and leaving said slip in said mold for a predetermined time, removing said mold from said green shaped body and drying said green shaped body, heating said dry green shaped body in a furnace to a sintering temperature in the range from 1350° to 1450° C. at a heating range of from 5 to 60 K/min to sinter the shaped body wherein it is exposed to a temperature of above 1300° C. for a time of at least 40 minutes and cooling said sintered shaped body at a cooling rate of above 5 K/min to a temperature of about 1000° C.

2. The process of claim 1, wherein prior to introduction into the mold the slip is briefly subjected to reduced pressure.

3. The process of claims 1 or 2, wherein while introducing the slip into the mold and/or while it is left in the mold, a pressure difference is maintained between the free surface of the slip and the external surface of the mold not wetted by the slip, in such a way that the pressure on the external surface is lower than that on the free surface of the slip.

4. The process of claim 3, wherein a pressure of less than 0.8 bar is maintained on the external surface of the mold.

5. The process of claim 3 wherein the mold is inserted into a container which is maintained at a pressure below atmospheric pressure.

6. The process of claim 1, wherein the slip is left in the mold for a time of from 5 to 400 minutes to form the green shaped body.

7. The process of claim 1, wherein the green shaped body is dried by heating from room temperature to about 300° C.

8. The process of claim 7, wherein the temperature is increased stepwise to 300° C.

9. The process of claim 8, wherein the temperature steps are selected so as to be smaller in the temperature range below 100° C. than in the temperature range from 100° to 300° C.

10. The process of claim 1, wherein the drying of the green shaped body is carried out under reduced pressure.

11. The process of claim 1, wherein the dried green shaped body is exposed for a time of from 30 to 200 min to a temperature in the range from 900° to 1100° C.

12. The process of claim 1, wherein the green shaped body is held at the sintering temperature for a time which is increased with increasing heating rate.

13. The process of claim 1, wherein an oxidizing atmosphere is maintained in the furnace for the high-temperature sintering of the green shaped body.

14. The process of claim 1, wherein a thin rough sintered surface layer is removed from the cooled shaped body mechanically or by brief treatment with hydrofluoric acid.

15. The process of claim 1, wherein the slip introduced into the mold has a pH in the range from 3 to 5.

16. The process of claim 1, wherein the starting material used is quartz glass scrap.

17. The process of claim 4, wherein the mold is inserted into a container which is maintained at a pressure below atmospheric pressure.

* * * * *